United States Patent
Fujiwara (10) Patent No.: US 8,674,445 B2
(45) Date of Patent: Mar. 18, 2014

(54) ELECTROSTATIC DISCHARGE FAILURE PROTECTIVE ELEMENT, ELECTROSTATIC DISCHARGE FAILURE PROTECTIVE CIRCUIT, SEMICONDUCTOR DEVICE AND SEMICONDUCTOR DEVICE MANUFACTURING METHOD

(75) Inventor: Shuji Fujiwara, Hashima (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 879 days.

(21) Appl. No.: 12/678,354

(22) PCT Filed: Sep. 26, 2008

(86) PCT No.: PCT/JP2008/067392
§ 371 (c)(1),
(2), (4) Date: Mar. 16, 2010

(87) PCT Pub. No.: WO2009/041558
PCT Pub. Date: Apr. 2, 2009

(65) Prior Publication Data
US 2010/0200911 A1 Aug. 12, 2010

(30) Foreign Application Priority Data
Sep. 28, 2007 (JP) ................. 2007-254288

(51) Int. Cl.
*H01L 23/62* (2006.01)
(52) U.S. Cl.
USPC ............................ 257/355; 257/356; 257/357
(58) Field of Classification Search
USPC .............................................. 257/355–357
See application file for complete search history.

(56) References Cited

U.S. PATENT DOCUMENTS

| | | | |
|---|---|---|---|
| 5,545,572 A | 8/1996 | Lee et al. | |
| 5,907,174 A | 5/1999 | Lee et al. | |
| 5,932,914 A | 8/1999 | Horiguchi | |
| 6,399,990 B1 * | 6/2002 | Brennan et al. | 257/355 |
| 6,455,902 B1 | 9/2002 | Voldman | |
| 6,777,723 B1 | 8/2004 | Narita | |

(Continued)

FOREIGN PATENT DOCUMENTS

| | | |
|---|---|---|
| JP | 07-202196 | 8/1995 |
| JP | 10-041469 | 2/1998 |
| JP | 2000-133799 | 5/2000 |

(Continued)

OTHER PUBLICATIONS

Haigang Feng., et al., "A Mixed-Mode ESD Protection Circuit Simulation-Design Methodology", IEE Journal of Solid-State Circuits, vol. 38, No. 6, Jun. 2003, pp. 995-1006, IEEE.

*Primary Examiner* — Samuel Gebremariam
(74) *Attorney, Agent, or Firm* — McDermott Will & Emery LLP (57) ABSTRACT

An electrostatic discharge failure protective element (50) is provided with second conductivity type source region (4) and drain region (5), which are formed at a prescribed interval to sandwich a channel region (3) on the surface of a first conductivity type semiconductor substrate (1); a first conductivity type well region (7) formed to cover the source region; a second conductivity type buried layer (8) formed below the first conductivity type well region; a second conductivity type first impurity region (9a) formed between the drain region and the buried layer to constitute a current path; and a second conductivity type second impurity region (9b) to isolate the well region and the semiconductor substrate one from the other.

12 Claims, 4 Drawing Sheets

(56) References Cited

U.S. PATENT DOCUMENTS

| | | |
|---|---|---|
| 7,429,774 B2 * | 9/2008 | Cheng et al. ............ 257/355 |
| 2003/0049907 A1 | 3/2003 | Omi et al. |
| 2006/0186469 A1 | 8/2006 | Nakamura |
| 2006/0255411 A1 | 11/2006 | Suzuki et al. |

FOREIGN PATENT DOCUMENTS

| | | |
|---|---|---|
| JP | 2003-197908 | 7/2003 |
| JP | 2006-074012 | 3/2006 |
| JP | 2006-202847 | 8/2006 |
| JP | 2006-319072 | 11/2006 |

* cited by examiner

ELECTROSTATIC DISCHARGE FAILURE PROTECTIVE ELEMENT, ELECTROSTATIC DISCHARGE FAILURE PROTECTIVE CIRCUIT, SEMICONDUCTOR DEVICE AND SEMICONDUCTOR DEVICE MANUFACTURING METHOD

RELATED APPLICATIONS

This application is the U.S. National Phase under 35 U.S.C. 0371 of International Application No. PCT/JP2008/067392, filed on Sep. 26, 2008, which in turn claims the benefit of Japanese Application No. 2007-254288, filed on Sep. 28, 2007, the disclosures of which Applications are incorporated by reference herein.

TECHNICAL FIELD

The present invention relates to an electrostatic discharge failure protective element, an electrostatic discharge failure protective circuit, a semiconductor device and a method of manufacturing a semiconductor device, and more particularly, it relates to an electrostatic discharge failure protective element comprising a field-effect transistor, an electrostatic discharge failure protective circuit, a semiconductor device employing an electrostatic discharge failure protective circuit and a method of manufacturing a semiconductor device.

BACKGROUND ART

An electrostatic discharge failure protective circuit comprising a field-effect transistor is known in general. Such an electrostatic discharge failure protective circuit is disclosed in 'Haigang Feng et al., "A Mixed-Mode ESD Protection Circuit Simulation-Design Methodology", IEEE JOURNAL OF SOLID-STATE CIRCUITS, VOL. 38, NO. 6, JUNE 2003', for example.

Such a structure that an electrostatic discharge failure protective circuit comprising a field-effect transistor is connected between a power supply terminal and a grounding terminal is disclosed in the aforementioned document. The electrostatic discharge failure protective circuit described in the aforementioned document is the so-called gcnMOS transistor (gate-coupled nMOS transistor) comprising an RC trigger circuit, to which a gate terminal of the field-effect transistor is connected. This gcnMOS transistor is so employed as the electrostatic discharge failure protective circuit that it is possible to swiftly discharge electrostatic surge current, dissimilarly to the so-called ggnMOS transistor (gate-grounded nMOS transistor) in which a gate terminal is connected to a grounding terminal.

In a BiCMOS-type LSI, a structure employing the aforementioned gcnMOS transistor as an electrostatic discharge failure protective circuit is known in general. Such a structure is disclosed in 'U.S. Pat. No. 6,455,902B1', for example.

In the aforementioned U.S. Pat. No. 6,455,902B1, a field-effect transistor as an electrostatic discharge failure protective element, a CMOS transistor and a bipolar transistor are formed on a semiconductor substrate. Further, a buried $n^+$ layer as a collector is formed in a region where the bipolar transistor is formed. In the aforementioned U.S. Pat. No. 6,455,902B1, a buried $n^+$ layer is formed also in a region where the electrostatic discharge failure protective element is formed, similarly to the region where the bipolar transistor is formed. In the aforementioned U.S. Pat. No. 6,455,902B1, further, a potential fixing terminal for each buried $n^+$ layer is provided on a position over an isolation layer adjacent to a drain region, while the potential fixing terminal and the buried $n^+$ layer are electrically connected with each other by an n-type impurity layer. A gate electrode and a potential fixing terminal for a p-type impurity region are electrically connected to an RC trigger circuit, the drain region and the potential fixing terminal for the buried $n^+$ layer are connected to a power supply wire, and a source region is connected to a ground wire.

In this U.S. Pat. No. 6,455,902B1, electrostatic surge current flows as channel current between a source and a drain, while part thereof also flows between the source region and the potential fixing terminal for the buried $n^+$ layer. In other words, the n-type source region, the p-type impurity region and the buried $n^+$ layer function as an emitter, a base and a collector of a parasitic bipolar transistor respectively, whereby part of the electrostatic surge current flows from the potential fixing terminal for the buried $n^+$ layer to the n-type source region successively through the n-type impurity layer, the buried $n^+$ layer and the p-type impurity region. In the aforementioned U.S. Pat. No. 6,455,902B1, part of the electrostatic surge current is fed between the source region and the potential fixing terminal for the buried $n^+$ layer for reducing the current (electrostatic surge current) flowing between the source and drain as the channel current, thereby reducing a load applied between the source and the drain.

In the aforementioned U.S. Pat. No. 6,455,902B1, however, part of the electrostatic surge current is fed between the potential fixing terminal for the buried $n^+$ layer formed over the isolation layer adjacent to the drain region and the source region, and hence resistance increases since a current path for part of the electrostatic surge current lengthens due to the potential fixing terminal for the buried $n^+$ layer and the source region formed over the isolation layer. Therefore, current (part of the electrostatic surge current) does not easily flow between the potential fixing terminal for the buried $n^+$ layer and the source region and hence the current (electrostatic surge current) as the channel current largely flows between the source and the drain, and there is such a problem that the load applied between the source and the drain is not sufficiently reduced as a result.

DISCLOSURE OF THE INVENTION

The present invention has been proposed in order to solve the aforementioned problem, and an object of the present invention is to provide an electrostatic discharge failure protective element capable of further reducing a load applied between a source and a drain by electrostatic surge current, an electrostatic discharge failure protective circuit, a semiconductor device and a method of manufacturing a semiconductor device.

An electrostatic discharge failure protective element according to a first aspect of the present invention comprises a second conductivity type source region and a second conductivity type drain region formed on the surface of a first conductivity type semiconductor substrate at a prescribed interval from each other to hold a channel region therebetween, a first conductivity type well region formed to cover the source region, a second conductivity type buried layer formed under the first conductivity type well region, a second conductivity type first impurity region formed to constitute a current path between the drain region and the buried layer, and a second conductivity type second impurity region isolating the well region and the semiconductor substrate from each other.

An electrostatic discharge failure protective circuit according to a second aspect of the present invention comprises an electrostatic discharge failure protective element including a second conductivity type source region and a second conductivity type drain region formed on the surface of a first conductivity type semiconductor substrate at a prescribed interval from each other to hold a channel region therebetween, a first conductivity type well region formed to cover the source region, a second conductivity type buried layer formed under the first conductivity type well region, a second conductivity type first impurity region formed to constitute a current path between the drain region and the buried layer and a second conductivity type second impurity region isolating the well region and the semiconductor substrate from each other and at least either a capacitance element or a resistance element electrically connected to the electrostatic discharge failure protective element.

A semiconductor device according to a third aspect of the present invention includes an electrostatic discharge failure protective element including a second conductivity type source region and a second conductivity type drain region formed on the surface of a first conductivity type semiconductor substrate at a prescribed interval from each other to hold a channel region therebetween, a first conductivity type well region formed to cover the source region, a second conductivity type buried layer formed under the first conductivity type well region, a second conductivity type first impurity region formed to constitute a current path between the drain region and the buried layer and a second conductivity type second impurity region isolating the well region and the semiconductor substrate from each other and an electrostatic discharge failure protective circuit comprising at least either a capacitance element or a resistance element electrically connected to the electrostatic discharge failure protective element.

A method of manufacturing a semiconductor device according to a fourth aspect of the present invention is a method of manufacturing a semiconductor device in which an electrostatic discharge failure protective element and a field-effect transistor are formed on the surface of a first conductivity type semiconductor substrate, comprising the steps of forming a second conductivity type buried layer on a first element region of the semiconductor substrate where the electrostatic discharge failure protective element is formed, simultaneously introducing an impurity into the first element region of the semiconductor substrate and a second element region where the field-effect transistor is formed thereby forming a second conductivity type well region on the second element region while forming a second conductivity type impurity region constituting a current path with the buried layer on the first element region, and forming a second conductivity type source region and a second conductivity type drain region constituting a current path between the same and the buried layer through the impurity region on the first element region at a prescribed interval from each other to hold a channel region therebetween.

BEST MODES FOR CARRYING OUT THE INVENTION

Embodiments of the present invention are now described with reference to the drawings.

(First Embodiment)

Figure 1:
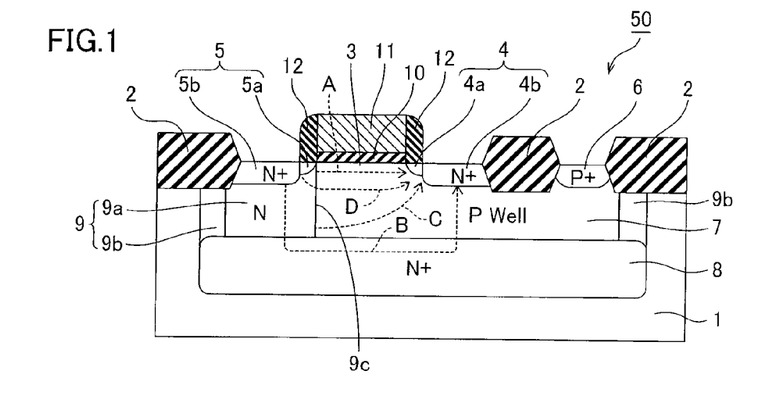
FIG. 1 A sectional view showing an electrostatic discharge failure protective element according to a first embodiment of the present invention.

In an electrostatic discharge failure protective element 50 according to a first embodiment, isolation layers 2 are formed on prescribed regions of the surface of a p-type silicon substrate 1, as shown in FIG. 1. On the surface of the silicon substrate 1, a source region 4 and a drain region 5 are formed at a prescribed interval from each other to hold a channel region 3 therebetween. The source region 4 has an LDD (Light Doped Drain) structure consisting of a low-concentration $n^-$-type impurity region 4a and an $n^+$-type high-concentration impurity region 4b. The drain region 5 has an LDD structure consisting of a low-concentration $n^-$-type impurity region 5a and an $n^+$-type high-concentration impurity region 5b. A $p^+$-type high-concentration impurity region 6 functioning as a potential fixing terminal for a p-type well region 7 described later is formed on a region of the surface of the silicon substrate 1 adjacent to the source region 4 through the corresponding isolation layer 2. The p-type well region 7 is formed to cover the source region 4 and the impurity region 6. An $n^+$-type high-concentration buried layer 8 is formed under the p-type well region 7. An n-type layer 9 and an n-type layer 9b isolating the p-type silicon substrate 1 and the p-type well region 7 from each other are formed on both side surfaces of the p-type well region 7. The n-type layer 9 formed under the drain region 5 includes an n-type layer 9a electrically connecting the buried layer 8 and the drain region 5 with each other while constituting a current path between the drain region 5 and the buried layer 8 and an n-type layer 9b isolating the p-type silicon substrate 1 and the p-type well region 7 from each other. A gate electrode 11 is formed on the channel region 3 through a gate insulating film 10. Sidewall insulating films 12 are formed on both side surfaces of the gate electrode 11. An n-type MOS transistor is constituted of the channel region 3, the source region 4, the drain region 5 and the gate electrode 11 described above. The n-type layer 9, the n-type layer 9a and the p-type well region 7 are examples of the "second impurity region", the "first impurity region" and the "well region" in the present invention respectively.

The impurity concentration in the n-type layer 9 is lower than the impurity concentration in the n$^+$-type impurity region 5b constituting the drain region 5. The position of an end portion 9c of the n-type layer 9 (n-type layer 9a) closer to the channel region 3 is substantially equal to the position of an end portion of an n$^-$-type impurity region 5a of the drain region 5 closer to the channel region 3.

In the electrostatic discharge failure protective element 50 according to the first embodiment, the n-type source region 4, the p-type well region 7 and the n-type buried layer 8 function as an emitter, a base and a collector of a parasitic bipolar transistor respectively. This parasitic bipolar transistor is capable of feeding part of current flowing into the drain region 5 to the source region 4 through the p-type well region 7, the buried layer 8 and the n-type layer 9 (n-type layer 9a). In other words, the electrostatic discharge failure protective element 50 according to the first embodiment is capable of feeding electrostatic surge current flowing into the drain region 5 from the drain region 5 to the source region 4 through a current path A where channel current of the n-type MOS transistor flows, and feeding part of the electrostatic surge current from the drain region 5 to the source region 4 through a first current path B consisting of the p-type well region 7, the buried layer 8 and the n-type layer 9 (n-type layer 9a).

In the electrostatic discharge failure protective element 50, current of a parasitic bipolar transistor formed by the source region 4, the p-type well region 7 and the n-type layer 9 (n-type layer 9a) functioning as an emitter, a base and a collector respectively flows from the drain region 5 to the source region 4 through a second current path C consisting of the n-type layer 9 (n-type layer 9a) and the p-type well region 7. In the electrostatic discharge failure protective element 50, further, current of a parasitic bipolar transistor formed by the source region 4, the p-type well region 7 and the drain region 5 functioning as an emitter, a base and a collector respectively flows from the drain region 5 to the source region 4 through a third current path D consisting of the p-type well region 7.

According to the first embodiment, as hereinabove described, the n-type source region 4, the p-type well region 7 and the n-type buried layer 8 are made to function as the emitter, the base and the collector of the parasitic bipolar transistor respectively, whereby part of the electrostatic surge current can be fed from the drain region 5 to the source region 4 successively through the p-type well region 7, the buried layer 8 and the n-type layer 9 (n-type layer 9a). In this case, part of the electrostatic surge current flows through the current path between the drain region 5 and the source region 4 not over the isolation layers 2, whereby the current path (first current path B) for part of the electrostatic surge current can be reduced by not extending over the isolation layers 2. Further, the current path for part of the electrostatic surge current is so short that resistance of the current path is also reduced, whereby the current (part of the electrostatic surge current) flowing through the first current path B can be increased. Consequently, the electrostatic surge current flowing as channel current between a source and a drain can be reduced, whereby a load applied between the source and the drain by the electrostatic surge current can be further reduced. In addition, the load applied between the source and the drain can be reduced, whereby the width of the gate electrode 11 can be further reduced. Therefore, the area of the electrostatic discharge failure protective element 50 can be reduced due to the reduction of the width of the gate electrode 11.

According to the first embodiment, as hereinabove described, the n-type layer 9 (n-type layer 9a) is formed to cover the drain region 5 while the impurity concentration in the n-type layer 9a is rendered lower than the impurity concentration in the n$^+$-type impurity region 5b constituting the drain region 5, whereby impurity concentration distribution in a p-n junction in the vicinity of the drain region 5 can be loosened. Thus, field concentration in the vicinity of the drain region 5 can be relaxed, whereby occurrence of impact ionization can be suppressed.

According to the first embodiment, as hereinabove described, the end portion 9c of the n-type layer 9 (n-type layer 9a) closer to the channel region 3 is arranged on the position substantially equal to the end portion of the n$^-$-type impurity region 5a of the drain region 5 closer to the channel region 3, whereby increase in resistance between the source region 4 and the drain region 5 resulting from the n-type layer 9 (n-type layer 9a) having the low impurity concentration can be suppressed as compared with a case where the end portion of the n-type layer 9 (n-type layer 9a) closer to the channel region 3 is positioned on a side closer to the channel region 3 than the end portion of the drain region 5 closer to the channel region 3.

(Second Embodiment)

An electrostatic discharge failure protective circuit 100 according to a second embodiment of the present invention employs the electrostatic discharge failure protective element 50 according to the aforementioned first embodiment.

Figure 2:
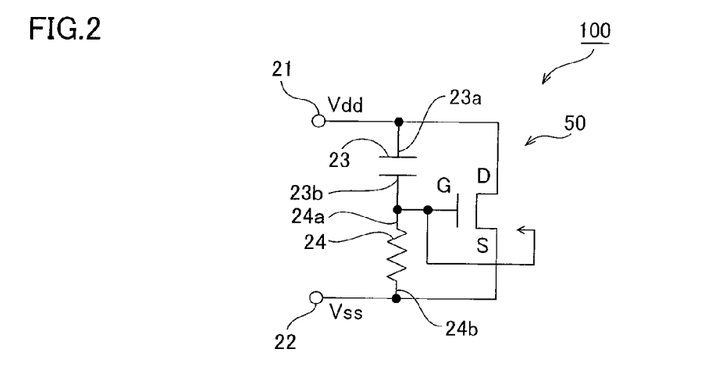
FIG. 2 A circuit diagram showing an electrostatic discharge failure protective circuit according to a second embodiment of the present invention.

As shown in FIG. 2, the electrostatic discharge failure protective circuit 100 has such a structure that a power supply terminal (Vdd) 21, a grounding terminal (Vss) 22, a capacitance element 23 and a resistance element 24 are electrically connected with the electrostatic discharge failure protective element 50 according to the aforementioned first embodiment. More specifically, the power supply terminal 21 and a first terminal 23a of the capacitance element 23 are connected with each other. A second terminal 23b of the capacitance element 23 and a first terminal 24a of the resistance element 24 are connected with each other. A second terminal 24b of the resistance element 24 and the grounding terminal 22 are connected with each other.

The gate electrode 11 of the electrostatic discharge failure protective element 50 and the impurity region 6 as the potential fixing terminal for the p-type well region 7 are connected to the second terminal 23b of the capacitance element 23 and the first terminal 24a of the resistance element 24. The drain region 5 is connected to the power supply terminal 21. The source region 4 is connected to the grounding terminal 22.

Operations of the electrostatic discharge failure protective circuit 100 are now described.

In such an ordinary operation that no electrostatic surge current is applied, the drain region 5, the n-type layer 9 (n-type layer 9a) and the buried layer 8 as the collectors of the parasitic bipolar transistors so are connected to the power supply terminal 21 (Vdd) that the same are positively biased with respect to the source region 4 as the emitters of the parasitic bipolar transistors. The gate electrode 11 and the impurity region 6 as the potential fixing terminal for the p-type well region 7 are at the same potential (0 V) as the grounding terminal 22 in the ordinary operation, whereby the nMOS transistor of the electrostatic discharge failure protective element 50 is kept in such a nonconducting state that no channel inversion layer is formed in the channel region 3.

In a case where positive polarity electrostatic surge current flows into the power supply terminal 21 or in a case where negative polarity electrostatic surge current flows into a ground wire 21, the potentials of the gate electrode 11 and the p-type well layer 7 are positively biased with respect to the grounding terminal 22. Thus, the potential of the gate electrode 11 is raised, whereby a channel inversion layer of the nMOS transistor of the electrostatic discharge failure protective element 50 is formed, and electrostatic surge current as channel current of the nMOS transistor flows from the drain region 5 to the source region 4. Further, the potential of the p-type well region 7 so rises that the base potentials of the parasitic bipolar transistors rise, while the first current path B consisting of the p-type well region 7, the buried layer 8 and the n-type layer 9 (n-type layer 9a), or the second current path C consisting of the p-type well region 7 and the buried layer 8, or the third current path D consisting of the p-type well region 7 is formed between the source region 4 and the drain region 5. Part of the electrostatic surge current flows from the drain region 5 to the source region 4 connected to the grounding terminal 22 through the current path. Thus, discharge of the electrostatic surge current by the electrostatic discharge failure protective circuit 100 according to the second embodiment is performed.

According to the second embodiment, as hereinabove described, the electrostatic surge current between the power supply terminal 21 and the grounding terminal 22 can be discharged by the electrostatic discharge failure protective element 50 while reducing the load applied between the source and the drain of the electrostatic discharge failure protective element 50 by the electrostatic surge current, by electrically connecting the power supply terminal 21, the first terminal 23a of the capacitance element 23 and the drain region 5 of the electrostatic discharge failure protective element 50 with each other, electrically connecting the second terminal 23b of the capacitance element 23, the first terminal 24a of the resistance element 24, the gate electrode 11 of the electrostatic discharge failure protective element 50 and the impurity region 6 as the potential fixing terminal for the p-type well region 7 of the electrostatic discharge failure protective element 50 with each other and electrically connecting the grounding terminal 22, the second terminal 24b of the resistance element 24 and the source region 4 of the electrostatic discharge failure protective element 50 with each other.

(Third Embodiment)

Figure 3:
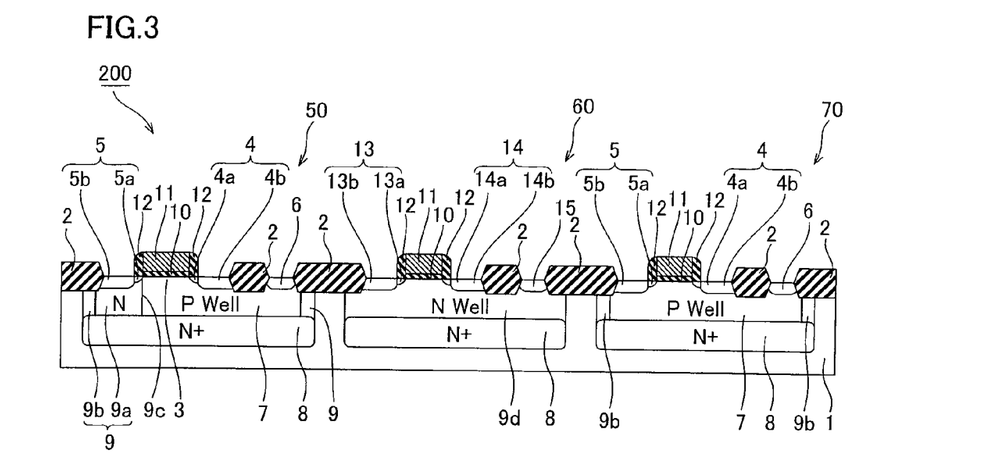
FIG. 3 A sectional view showing a semiconductor device according to a third embodiment of the present invention.

As shown in FIG. 3, this semiconductor device 200 is such a BiCMOS-type semiconductor device that an nMOS transistor 60 and a pMOS transistor 70 as well as a bipolar transistor (not shown) are formed on a p-type silicon substrate 1. The electrostatic discharge failure protective element 50 according to the aforementioned first embodiment is formed on the p-type silicon substrate 1 of this BiCMOS-type semiconductor device 200. The electrostatic discharge failure protective element 50 is formed to constitute the electrostatic discharge failure protective circuit 100 shown in FIG. 2 along with the power supply terminal (Vdd) 21, the grounding terminal (Vss) 22, the capacitance element 23 and the resistance element 24 which are not shown. In this semiconductor device 200, a buried layer functioning as a collector of the bipolar transistor is employed as the buried layer 8 of the electrostatic discharge failure protective element 50.

According to the third embodiment, the electrostatic discharge failure protective circuit 100 is so incorporated into the semiconductor device 200 that electrostatic surge current between the power supply terminal 21 and the grounding terminal 22 can be discharged by the electrostatic discharge failure protective element 50 while reducing the load applied between the source and the drain of the electrostatic discharge failure protective element 50 by the electrostatic surge current, whereby resistance of the semiconductor device 200 against the electrostatic surge current can be increased.

A manufacturing process for the semiconductor device 200 is now described with reference to FIGS. 3 to 8.

Figure 4:
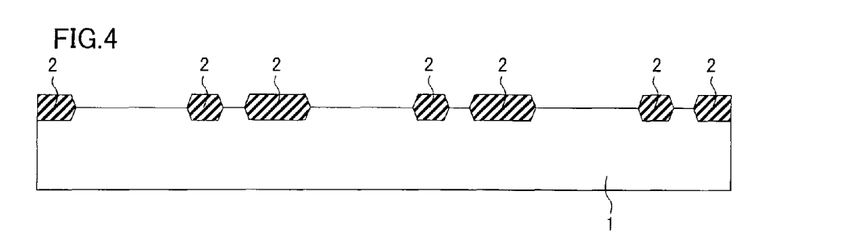
FIG. 4 A sectional view for illustrating a manufacturing process for the semiconductor device according to the third embodiment of the present invention.
Figure 5:
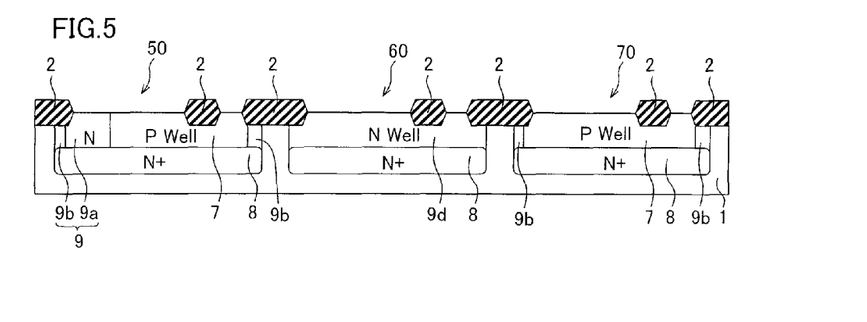
FIG. 5 A sectional view for illustrating the manufacturing process for the semiconductor device according to the third embodiment of the present invention.

First, isolation layers 2 are formed on the p-type silicon substrate 1 by a LOCOS (Local Oxidation of Silicon) method, as shown in FIG. 4. Then, an n-type impurity is ion-implanted into prescribed regions of the surface of the silicon substrate 1, thereby forming an n-type buried layer (not shown) functioning as a collector of an npn bipolar transistor and the n-type buried layer 8 of the electrostatic discharge failure protective element 50, as shown in FIG. 5. Further, an n-type impurity is ion-implanted into other regions of the surface of the silicon substrate 1, thereby forming an n-type well 9d of the pMOS transistor 60, the n-type layer 9 (n-type layers 9a and 9b) of the electrostatic discharge failure protective element 50 and an n-type layer 9b of the nMOS transistor 70. In addition, a p-type impurity is ion-implanted into further other regions of the surface of the silicon substrate 1, thereby forming a p-type well region 7 of the nMOS transistor 70 and the p-type well region 7 of the electrostatic discharge failure protective element 50.

Figure 6:
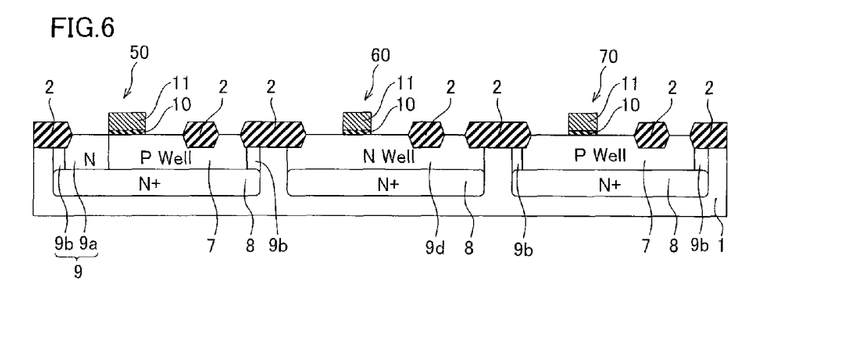
FIG. 6 A sectional view for illustrating the manufacturing process for the semiconductor device according to the third embodiment of the present invention.
Figure 7:
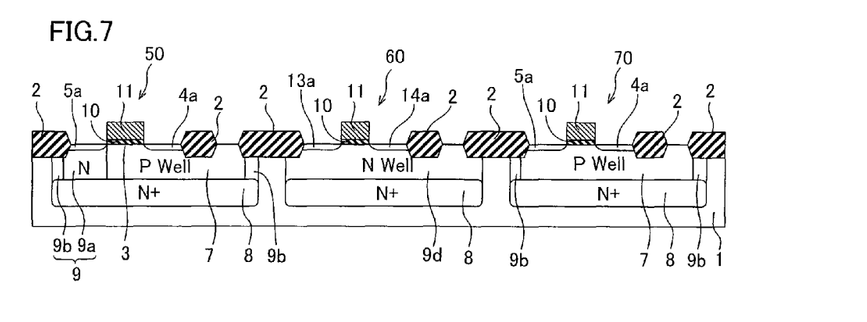
FIG. 7 A sectional view for illustrating the manufacturing process for the semiconductor device according to the third embodiment of the present invention.

Then, gate insulating films 10 and gate electrodes 11 are formed on regions where the electrostatic discharge failure protective element 50, the pMOS transistor 60 and the nMOS transistor 70 are formed respectively, as shown in FIG. 6. Then, an n-type impurity is ion-implanted through the isolation layers 2 and the gate electrodes 11 serving as masks, thereby forming low-concentration impurity regions 4a and 5a on the regions where the electrostatic discharge failure protective element 50 and the nMOS transistor 70 are formed, as shown in FIG. 7. Further, a p-type impurity is ion-implanted, thereby forming low-concentration impurity regions 13a and 14a on the region where the pMOS transistor 60 is formed.

Figure 8:
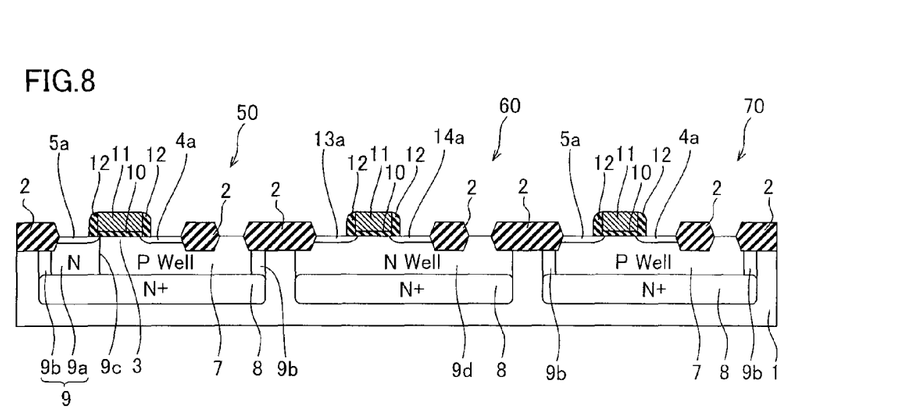
FIG. 8 A sectional view for illustrating the manufacturing process for the semiconductor device according to the third embodiment of the present invention.

Thereafter an insulating film (not shown) is deposited and etch-back is thereafter performed, thereby forming sidewall insulating films 12 covering the side surfaces of the gate electrodes 11, as shown in FIG. 8. Then, ion implantation is performed through the sidewall insulating films 12 serving as masks, thereby forming high-concentration impurity regions 4b and 5b of the electrostatic discharge failure protective element 50 and the nMOS transistor 70 and a high-concentration impurity region 15 as a potential fixing terminal for the n-type well 9d of the pMOS transistor 60, as shown in FIG. 3. Further, ion implantation is performed through the sidewall insulating films 12 serving as masks, thereby forming high-concentration impurity regions 6 as potential fixing terminals for the p-type well regions 7 of the electrostatic discharge failure protective element 50 and the nMOS transistor 70 and high-concentration impurity regions 13b and 14b of the pMOS transistor 60. Thus, source regions 4 and drain regions 5 consisting of LDD structures are formed on the electrostatic discharge failure protective element 50 and the nMOS transistor 70, while a source region 13 and a drain region 14 consisting of LDD structures are formed on the pMOS transistor 60.

Thereafter the semiconductor device 200 according to the third embodiment is formed by forming the power supply terminal 21, the grounding terminal 22, the capacitance element 23 and the resistance element 24 shown in FIG. 2.

According to the third embodiment, the n-type impurity is simultaneously ion-implanted into the region where the electrostatic discharge failure protective element 50 is formed and the region where the pMOS transistor 60 is formed thereby forming the n-type layer 9 (n-type layer 9a) constituting the current path with the buried layer 8 on the region where the electrostatic discharge failure protective element 50 is formed simultaneously with forming the n-type well 9d on the region where the pMOS transistor 60 is formed, whereby the n-type layer 9 (n-type layer 9a) can be formed on the region where the electrostatic discharge failure protective element 50 is formed without separately adding a step for forming the n-type layer 9 (n-type layer 9a) on the region where the electrostatic discharge failure protective element 50 is formed.

The embodiments disclosed this time are to be considered as illustrative in all points and not restrictive. The scope of the present invention is shown not by the above description of the embodiments but by the scope of claims for patent, and all modifications within the meaning and range equivalent to the scope of claims for patent are further included.

Figure 9:
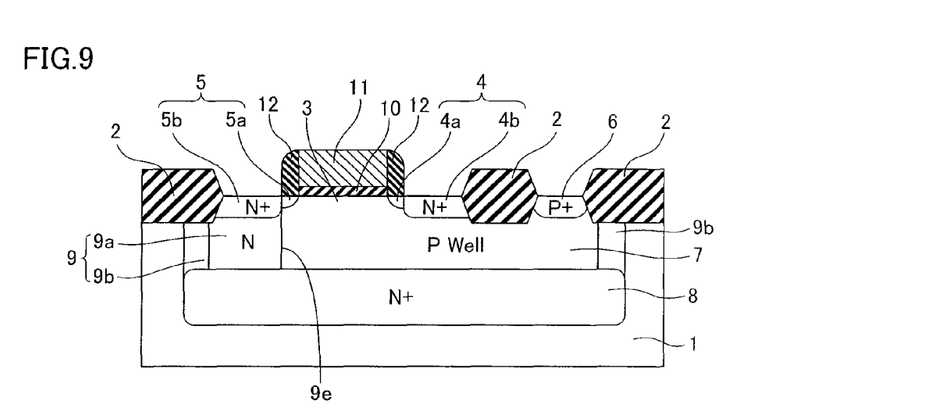
FIG. 9 A sectional view showing an electrostatic discharge failure protective element according to a first modification of the first embodiment of the present invention.
Figure 10:
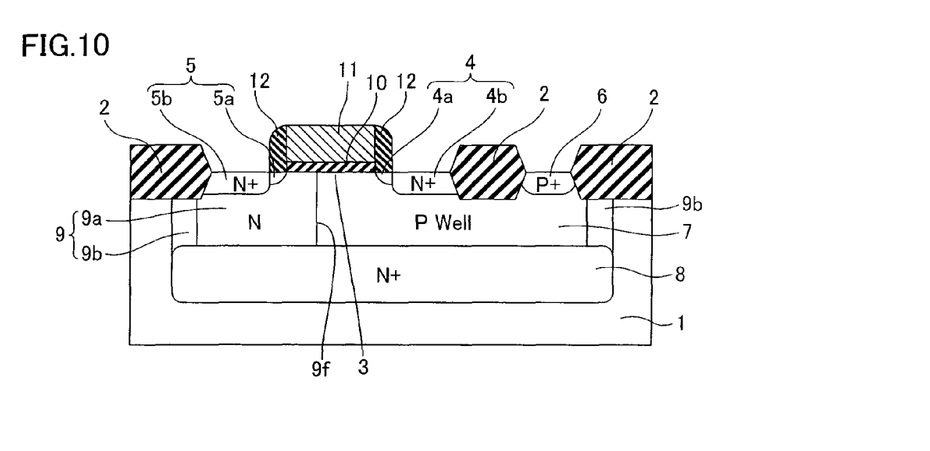
FIG. 10 A sectional view showing an electrostatic discharge failure protective element according to a second modification of the first embodiment of the present invention.

For example, while the example of forming the position of the end portion of the low-concentration impurity region 5a of the drain region 5 closer to the channel region 3 and the position of the end portion 9c of the n-type layer 9 (n-type layer 9a) closer to the channel region 3 to be substantially equal to each other has been shown in the aforementioned first embodiment, the present invention is not restricted to this, but the position of an end portion of the high-concentration impurity region 5b of the drain region 5 closer to the channel region 3 and the position of an end portion 9e of the n-type layer 9 closer to the channel region 3 may be formed to be substantially equal to each other as in a first modification of the first embodiment shown in FIG. 9, or the position of an end portion 9f of the n-type layer 9 closer to the channel region 3 may be formed to be located on a side closer to the channel region 3 than the position of the end portion of the low-concentration impurity region 5a of the drain region 5 closer to the channel region 3 as in a second modification of the first embodiment shown in FIG. 10.

While such an example that the n-type layer 9 and the n-type drain region 5 are connected with each other while the n-type layer 9 and the n-type buried layer 8 are connected with each other has been shown in the aforementioned first embodiment, the present invention is not restricted to this, but the drain region 5, the n-type layer 9 and the buried layer 8 may simply be substantially electrically connected with each other to constitute electric paths even if there is a clearance between the n-type layer 9 and the n-type drain region 5 or between the n-type layer 9 and the n-type buried layer 8 and the clearance is of a p-type.

While the example of forming the electrostatic discharge failure protective element 50 comprising the nMOS transistor has been shown in the aforementioned first embodiment, the present invention is not restricted to this, but an electrostatic discharge failure protective element comprising a pMOS transistor may be formed. In this case, the electrostatic discharge failure protective element may be connected between an input/output pin and a power supply terminal.

Figure 11:
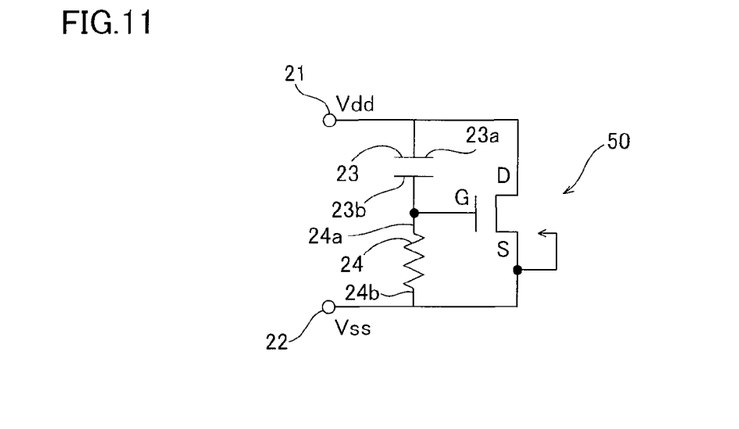
FIG. 11 A circuit diagram showing an electrostatic discharge failure protective circuit according to a first modification of the second embodiment of the present invention.
Figure 12:
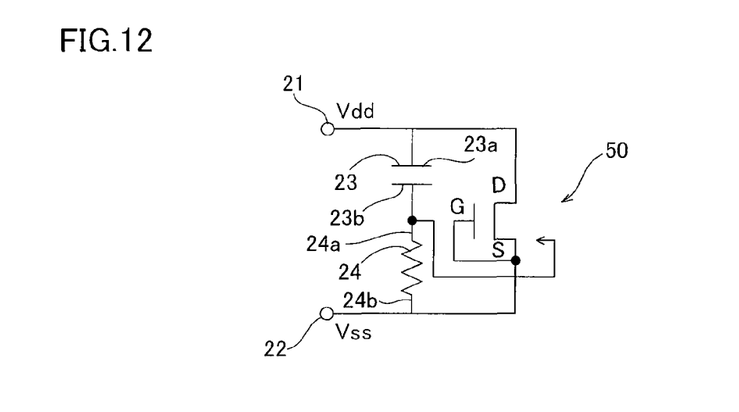
FIG. 12 A circuit diagram showing an electrostatic discharge failure protective circuit according to a second modification of the second embodiment of the present invention.
Figure 13:
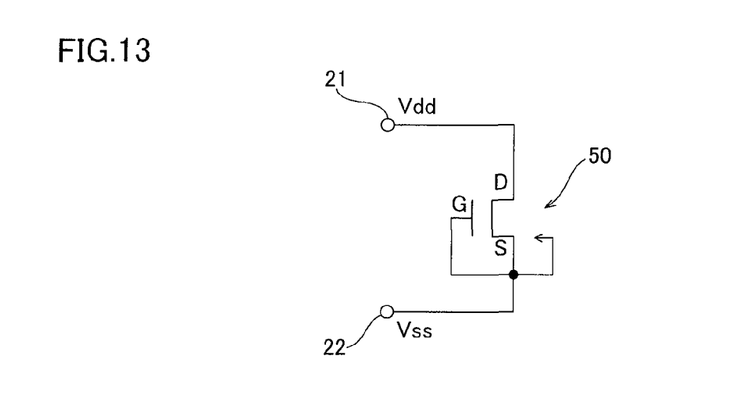
FIG. 13 A circuit diagram showing an electrostatic discharge failure protective circuit according to a third modification of the second embodiment of the present invention.

While the example of connecting the gate electrode 11 and the potential fixing terminal (impurity region 6) for the p-type well region 7 to the capacitance element 23 and the resistance element 24 has been shown in the aforementioned second embodiment, the present invention is not restricted to this, but the potential fixing terminal (impurity region 6) for the p-type well region 7 may be connected to the grounding terminal 22 while connecting the gate electrode 11 to the capacitance element 23 and the resistance element 24, as in a first modification of the second embodiment shown in FIG. 11. Further, the potential fixing terminal (impurity region 6) for the p-type well region 7 may be connected to the capacitance element 23 and the resistance element 24 while connecting the gate electrode 11 to the grounding terminal 22, as in a second modification of the second embodiment shown in FIG. 12. In addition, the gate electrode 11 and the potential fixing terminal (impurity region 6) for the p-type well region 7 may be connected to the grounding terminal 22, as in a third modification of the second embodiment shown in FIG. 13.

While the example of connecting the electrostatic discharge failure protective element 50 between the power supply terminal 21 and the grounding terminal 22 has been shown in the aforementioned second embodiment, the present invention is not restricted to this, but the electrostatic discharge failure protective element 50 may be connected between an input/output pin and a grounding terminal.

While the example of forming the buried layer 8 by ion-implanting the n-type impurity into the p-type silicon substrate 1 has been shown in the aforementioned third embodiment, the present invention is not restricted to this, but a buried layer may be formed by epitaxially growing a silicon layer after forming an n-type impurity layer on the surface of the p-type silicon substrate 1. In this case, formation of isolation layers, a p-type well and an n-type well (n-type layer) is performed after forming the epitaxial silicon layer.

While the example of simultaneously forming the n-type well 9d of the pMOS transistor 60 and the n-type layer 9 (n-type layer 9a) for connecting the drain region 5 and the buried layer 8 of the electrostatic discharge failure protective element 50 with each other has been shown in the aforementioned third embodiment, the present invention is not restricted to this, but a drawn-out layer of a buried layer generally formed on a collector portion of a vertical bipolar transistor and the n-type layer 9 may be simultaneously formed.

The invention claimed is:

1. An electrostatic discharge failure protective element comprising:
   a second conductivity type source region and a second conductivity type drain region formed on the surface of a first conductivity type semiconductor substrate at a prescribed interval from each other to hold a channel region therebetween;
   a first conductivity type well region formed to cover said source region;
   a second conductivity type buried layer formed under said first conductivity type well region;
   a second conductivity type first impurity region formed to constitute a current path between said drain region and said buried layer; and
   a second conductivity type second impurity region isolating said well region and said semiconductor substrate from each other, wherein:
   the impurity concentration in said first impurity region is lower than the impurity concentration in said second conductivity type drain region, and
   an end portion of said first impurity region closer to said channel region is arranged on a position substantially equal to an end portion of said channel region closer to said drain region or on a drain side portion away from the end portion of said channel region.

2. The electrostatic discharge failure protective element according to claim 1, wherein said first impurity region is formed to cover said drain region.

3. An electrostatic discharge failure protective circuit comprising:
   an electrostatic discharge failure protective element including a second conductivity type source region and a second conductivity type drain region formed on the surface of a first conductivity type semiconductor substrate at a prescribed interval from each other to hold a channel region therebetween, a first conductivity type well region formed to cover said source region, a second conductivity type buried layer formed under said first conductivity type well region, a second conductivity type first impurity region formed to constitute a current path between said drain region and said buried layer and a second conductivity type second impurity region isolating said well region and said semiconductor substrate from each other; and at least one of a capacitance element and a resistance element, electrically connected to said electrostatic discharge failure protective element, wherein:

the impurity concentration in said first impurity region is lower than the impurity concentration in said second conductivity type drain region, and an end portion of said first impurity region closer to said channel region is arranged on a position substantially equal to an end portion of said channel region closer to said drain region or on a drain side portion away from the end portion of said channel region.

4. The electrostatic discharge failure protective circuit according to claim 3, wherein
said first impurity region is formed to cover said drain region.

5. The electrostatic discharge failure protective circuit according to claim 3, further comprising a power supply wire and a ground wire, wherein:

said electrostatic discharge failure protective circuit includes both of said capacitance element and said resistance element, both of said capacitance element and said resistance element being electrically connected to said electrostatic discharge failure protective element, said electrostatic discharge failure protective element further includes a well potential fixing terminal for fixing the potential of said well region, said power supply wire, one terminal of said capacitance element and the drain region of said electrostatic discharge failure protective element are electrically connected with each other, another terminal of said capacitance element, one terminal of said resistance element, a gate electrode of said electrostatic discharge failure protective element and the well potential fixing terminal of said electrostatic discharge failure protective element are electrically connected with each other, and said ground wire, another terminal of said resistance element and the source region of said electrostatic discharge failure protective element are electrically connected with each other.

6. The electrostatic discharge failure protective circuit according to claim 3, further comprising a power supply wire and a ground wire, wherein:

said electrostatic discharge failure protective circuit includes both of said capacitance element and said resistance element, both of said capacitance element and said resistance element being electrically connected to said electrostatic discharge failure protective element, said electrostatic discharge failure protective element further includes a well potential fixing terminal for fixing the potential of said well region, said power supply wire, one terminal of said capacitance element and the drain region of said electrostatic discharge failure protective element are electrically connected with each other, another terminal of said capacitance element, one terminal of said resistance element and a gate electrode of said electrostatic discharge failure protective element are electrically connected with each other, and said ground wire, another terminal of said resistance element, the source region of said electrostatic discharge failure protective element and the well potential fixing terminal of said electrostatic discharge failure protective element are electrically connected with each other.

7. The electrostatic discharge failure protective circuit according to claim 3, further comprising a power supply wire and a ground wire, wherein:

said electrostatic discharge failure protective circuit includes both of said capacitance element and said resistance element, both of said capacitance element and said resistance element being electrically connected to said electrostatic discharge failure protective element, said electrostatic discharge failure protective element further includes a well potential fixing terminal for fixing the potential of said well region, said power supply wire, one terminal of said capacitance element and the drain region of said electrostatic discharge failure protective element are electrically connected with each other, another terminal of said capacitance element, one terminal of said resistance element and the well potential fixing terminal of said electrostatic discharge failure protective element are electrically connected with each other, and said ground wire, another terminal of said resistance element, the source region of said electrostatic discharge failure protective element and a gate electrode of said electrostatic discharge failure protective element are electrically connected with each other.

8. A semiconductor device including:

an electrostatic discharge failure protective element including a second conductivity type source region and a second conductivity type drain region formed on the surface of a first conductivity type semiconductor substrate at a prescribed interval from each other to hold a channel region therebetween, a first conductivity type well region formed to cover said source region, a second conductivity type buried layer formed under said first conductivity type well region, a second conductivity type first impurity region formed to constitute a current path between said drain region and said buried layer and a second conductivity type second impurity region isolating said well region and said semiconductor substrate from each other; and an electrostatic discharge failure protective circuit comprising at least one of a capacitance element and a resistance element, electrically connected to said electrostatic discharge failure protective element, wherein:

the impurity concentration in said first impurity region is lower than the impurity concentration in said second conductivity type drain region, and an end portion of said first impurity region closer to said channel region is arranged on a position substantially equal to an end portion of said channel region closer to said drain region or on a drain side portion away from the end portion of said channel region.

9. The semiconductor device according to claim 8, wherein said first impurity region is formed to cover said drain region.

10. The semiconductor device according to claim 8, wherein:

said electrostatic discharge failure protective circuit includes both of said capacitance element and said resistance element, both of said capacitance element and said resistance element being electrically connected to said electrostatic discharge failure protective element, said electrostatic discharge failure protective circuit further comprises a power supply wire and a ground wire, said electrostatic discharge failure protective element further includes a well potential fixing terminal for fixing the potential of said well region, said power supply wire, one terminal of said capacitance element and the drain region of said electrostatic discharge failure protective element are electrically connected with each other, another terminal of said capacitance element, one terminal of said resistance element, a gate electrode of said electrostatic discharge failure protective element and the well potential fixing terminal of said electrostatic discharge failure protective element are electrically connected with each other, and said ground wire, another terminal of said resistance element and the source region of said electrostatic discharge failure protective element are electrically connected with each other.

11. The semiconductor device according to claim 8, wherein:

said electrostatic discharge failure protective circuit includes both of said capacitance element and said resistance element, both of said capacitance element and said resistance element being electrically connected to said electrostatic discharge failure protective element, said electrostatic discharge failure protective circuit further comprises a power supply wire and a ground wire, said electrostatic discharge failure protective element further includes a well potential fixing terminal for fixing the potential of said well region, said power supply wire, one terminal of said capacitance element and the drain region of said electrostatic discharge failure protective element are electrically connected with each other, another terminal of said capacitance element, one terminal of said resistance element and a gate electrode of said electrostatic discharge failure protective element are electrically connected with each other, and said ground wire, another terminal of said resistance element, the source region of said electrostatic discharge failure protective element and the well potential fixing terminal of said electrostatic discharge failure protective element are electrically connected with each other.

12. The semiconductor device according to claim 8, wherein:

said electrostatic discharge failure protective circuit includes both of said capacitance element and said resistance element, both of said capacitance element and said resistance element being electrically connected to said electrostatic discharge failure protective element, said electrostatic discharge failure protective circuit further comprises a power supply wire and a ground wire, said electrostatic discharge failure protective element further includes a well potential fixing terminal for fixing the potential of said well region, said power supply wire, one terminal of said capacitance element and the drain region of said electrostatic discharge failure protective element are electrically connected with each other, another terminal of said capacitance element, one terminal of said resistance element and the well potential fixing terminal of said electrostatic discharge failure protective element are electrically connected with each other, and said ground wire, another terminal of said resistance element, the source region of said electrostatic discharge failure protective element and a gate electrode of said electrostatic discharge failure protective element are electrically connected with each other.

* * * * *